US006407618B1

(12) United States Patent
Taft et al.

(10) Patent No.: US 6,407,618 B1
(45) Date of Patent: Jun. 18, 2002

(54) METHOD AND APPARATUS FOR A BIAS GENERATOR WITH OUTPUT CURRENT DEPENDENT ON CLOCK FREQUENCY

(75) Inventors: Robert Callaghan Taft; Maria Rosaria Tursi, both of Munich (DE)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/851,005

(22) Filed: May 7, 2001

(51) Int. Cl.[7] .................................................. H03K 3/01
(52) U.S. Cl. ....................................... 327/534; 327/102
(58) Field of Search ................................ 327/102, 336, 327/337, 344, 345, 530, 534, 535, 536, 537

(56) References Cited

U.S. PATENT DOCUMENTS 5,365,121 A * 11/1994 Morton et al. .............. 327/170
5,585,756 A * 12/1996 Wang ......................... 327/307

OTHER PUBLICATIONS

Razavi, "Design of Analog CMOS Integrated Circuits," *McGraw–Hill Higher Education,* Aug. 2000, pp. 1–7;137–276;353–415.

* cited by examiner

*Primary Examiner*—Jeffrey Zweizig
(74) *Attorney, Agent, or Firm*—Merchant & Gould, P.C.; Brett A. Hertzberg

(57) ABSTRACT

An electronic circuit generates a bias current that is proportional to a frequency of a reference clock signal in a switched capacitor circuit. The electronic circuit includes a capacitive circuit selectively coupled to a transistor supplied by a voltage reference circuit. During a first phase the capacitive circuit is charged by a current from the transistor, and during the second phase the capacitive circuit is discharged to ground. The duration of each phase is related to the reference clock signal. The average current corresponds to a bias signal and is filtered to reduce ripple in the bias signal before the bias signal is received by the switched capacitor circuit. The capacitive circuit is configured with a first and second capacitor arranged in a complimentary out-of-phase configuration. During a first phase, the first capacitor is charged and the second capacitor is discharged. During the second phase, the second capacitor is charged and the first capacitor is discharged. The out-of-phase configuration reduces the size of each capacitor used for the capacitive circuit as compared to a single capacitor. The configuration also reduces ripple in the current, which reduces the size of the filter. The frequency dependant current is mirrored into the switched-capacitor circuit. In one example, the electronic circuit is implemented as an integrated circuit including "on-chip" capacitors that have inherent parasitic capacitances associated therewith. In this instance, the type and orientation of the electronic circuit capacitors should match the switched capacitor circuit capacitors such that parasitic effects track one another.

30 Claims, 6 Drawing Sheets

METHOD AND APPARATUS FOR A BIAS GENERATOR WITH OUTPUT CURRENT DEPENDENT ON CLOCK FREQUENCY

FIELD OF THE INVENTION

The present invention relates to a method and apparatus for a bias generator. In particular, the present invention relates to a method and apparatus for producing a reference current that is a dependent on a reference clock frequency.

BACKGROUND OF THE INVENTION

Analog and mixed signal circuits often employ the use of voltage and current reference signals. Typically, such reference signals are DC signals that exhibit insensitivity to certain parameter variations such as power supply variations, processing variations, and temperature variations. One type of reference generator that may be employed is referred to a "band-gap" reference circuit.

"Band-gap" reference circuits are employed to produce a reference signal that is temperature compensated over a desired temperature range. Bipolar transistors are employed to produce an output voltage that is roughly 1.2V, which corresponds to the band-gap voltage of Silicon. The thermal voltage (Vt) in a bipolar transistor has a positive temperature coefficient (Vt=kT/q), while the base-emitter voltage (Vbe) has a negative temperature coefficient. The band-gap reference circuit is arranged to provide temperature compensation by counteracting the positive temperature variation (Vt) with the negative temperature variation (Vbe) to produce an overall temperature variation that is proportional to (Vbe+nVt), where n is a constant. The constant n is chosen such that the overall temperature coefficient is positive, negative, or approximately zero. The band-gap reference circuit may be utilized to provide a reference signal in an analog (or mixed signal) circuit.

In some instances, analog circuits (or mixed signal circuits) utilize a signal that is not compensated for every parameter, and instead is sensitive to one or more parameters. It may be desirable to produce a reference voltage that increases with increasing temperature. For example, the speed associated with a transistor may degrade as temperature increases. Biasing the quiescent gate potential of the transistor with a voltage that increases with temperature compensates for changes in the speed of the transistor over temperature.

SUMMARY OF THE INVENTION

In accordance with the invention, a frequency dependent bias signal is produced for a switched capacitor circuit in response to a reference clock signal. The frequency dependent bias signal is generated by charging and discharging two capacitive circuits in a complimentary out-of-phase manner. The capacitive circuits within the present invention match the type, and orientation of another capacitive circuit that is within the switched capacitor circuit such that parasitic capacitances associated with the capacitive circuits effect the frequency dependant bias signal and the switched capacitor circuit similarly. Ripple in the frequency dependent bias signal is reduced by the complimentary out-of-phase operation, and by an optional ripple filter.

Briefly stated, an electronic circuit generates a bias current that is proportional to a frequency of a reference clock signal in a switched capacitor circuit. The electronic circuit includes a capacitive circuit that is selectively coupled to a transistor that is supplied by a voltage reference circuit.

During a first phase, the capacitive circuit is charged by a current from the transistor, and during the second phase, the capacitive circuit is discharged to ground. The duration of each phase is related to the reference clock signal. The average of the current corresponds to a bias signal and is filtered to reduce ripple in the bias signal before the bias signal is received by the switched capacitor circuit. The capacitive circuit is configured with a first and a second capacitor that are arranged in a complimentary out-of-phase configuration. During a first phase, the first capacitor is charged and the second capacitor is discharged. During the second phase, the second capacitor is charged and the first capacitor is discharged. The out-of-phase configuration reduces the size of each of the capacitors used for the capacitive circuit as compared to a single capacitor. The configuration also reduces ripple in the current, which in turn reduces the size of the filter. The frequency dependant current is mirrored into the switched-capacitor circuit. In one example, the electronic circuit is implemented as an integrated circuit including "on-chip" capacitors that have inherent parasitic capacitances associated therewith. In this instance, the type and orientation of the electronic circuit capacitors should match the switched capacitor circuit capacitors such that parasitic effects track one another.

An embodiment of the invention is directed to an apparatus, producing a frequency dependent bias signal for a switched capacitor circuit, wherein the frequency dependent bias signal is dependent on a reference clock signal that has a corresponding clock frequency, and the switched capacitor circuit includes a type of capacitive circuit. The apparatus includes a control circuit arranged to produce a control signal in response to a reference potential. A controlled circuit is arranged to produce a regulated potential in response to the control signal, wherein the regulated potential is related to the reference potential. A capacitive circuit is included that is the same type as the type of capacitive circuit within the switched capacitor circuit. A discharging circuit is arranged to discharge the capacitive circuit in response to a clock signal when the clock signal corresponds to a first logic level. A charging circuit is arranged to couple a charging current to the capacitive circuit in response to the control signal when the clock signal corresponds to a second logic level that is different from the first logic level such that the charging current charges the capacitive circuit. A sense circuit is arranged to produce the frequency dependent bias signal in response to an average of the charging current, wherein the average of the charging current is related to the clock signal.

Another embodiment of the invention is directed to an apparatus that generates a bias signal that is dependent on a reference clock signal having a corresponding clock frequency and a corresponding pulse-width. The apparatus includes a first capacitive circuit and a second capacitive circuit. A controlled current circuit is arranged to produce a charging current when a sensed potential at a sense node is different from a reference potential. A first charging circuit is arranged to couple the sense node to the first capacitive circuit in response to a first phase of a first clock signal such that the charging current charges the first capacitive circuit to a first charged potential during a first charging phase. A first discharging circuit is arranged to discharge the first capacitive circuit in response to a second phase of the first clock signal. A second charging circuit is arranged to couple the sense node to the second capacitive circuit in response to a first phase of a second clock signal such that the charging current charges the second capacitive circuit to a second charged potential during a second charging phase. A second discharging circuit is arranged to discharge the second capacitive circuit in response to a second phase of the second clock signal. An averaging circuit that is arranged to produce the bias signal in response to an average charging current, wherein the average charging current corresponds to an average of the charging current that is produced by the controlled current circuit such that the bias signal changes with changes in the reference clock signal.

Yet another embodiment of the invention is directed to a method for generating a frequency dependent bias signal. The method includes: sensing a potential at a sense node to produce a sensed potential, coupling a charging current to the sense node when the sensed potential is different from a reference potential, coupling the sense node to a first capacitive circuit such that the first capacitive circuit charges with a first charging current during a first phase of a first clock signal, decoupling the sense node from the first capacitive circuit during a second phase of the first clock signal, discharging the first capacitive circuit during the second phase of the first clock signal, coupling the sense node to a second capacitive circuit such that the second capacitive circuit charges with a second charging current during a first phase of a second clock signal, wherein the first phase of the first clock signal is inactive when the first phase of the second clock signal is active, decoupling the sense node from the second capacitive circuit during a second phase of the second clock signal, discharging the second capacitive circuit during the second phase of the second clock signal, and generating a bias signal in response to an average current that corresponds to an average of the first and second charging currents such that the bias signal is related to a frequency associated with the first and second clock signals.

Yet another embodiment of the invention is directed to an apparatus, providing a bias signal for a switched-capacitor circuit that uses a reference clock signal with a corresponding reference clock frequency. The apparatus includes a means for producing a first clock signal arranged to produce a first clock signal in response to the reference clock signal, the first clock signal having a first and second phase. A means for producing a second clock signal is arranged to produce a second clock signal in response to the reference clock signal, the second clock signal having a first and second phase, wherein the first phase of the second clock signal is non-overlapping with respect to the first phase of the first clock signal. A means for sensing is arranged to sense a sensed potential at a sense node. A means for producing a current is arranged to provide a charging current when the sensed potential is different from a reference potential. A first means for charging is arranged to couple the sense node to a first capacitive circuit such that the first capacitive circuit is charged with a first charging current to a first charged potential in response to the first phase of the first clock signal. A first means for discharging is arranged to discharge the first capacitive circuit in response to the second phase of the first clock signal. A second means for charging is arranged to couple the sense node to a second capacitive circuit such that the second capacitive circuit is charged with a second charging current to a second charged potential in response to the first phase of the second clock signal. A second means for discharging is arranged to discharge the second capacitive circuit in response to the second phase of the second clock signal. An averaging means is arranged to produce the bias signal in response to an average of the charging current, wherein the average of the charging current corresponds to the first and second charging currents such that the average of the charging current is related to the reference clock frequency.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION

Figure 1:
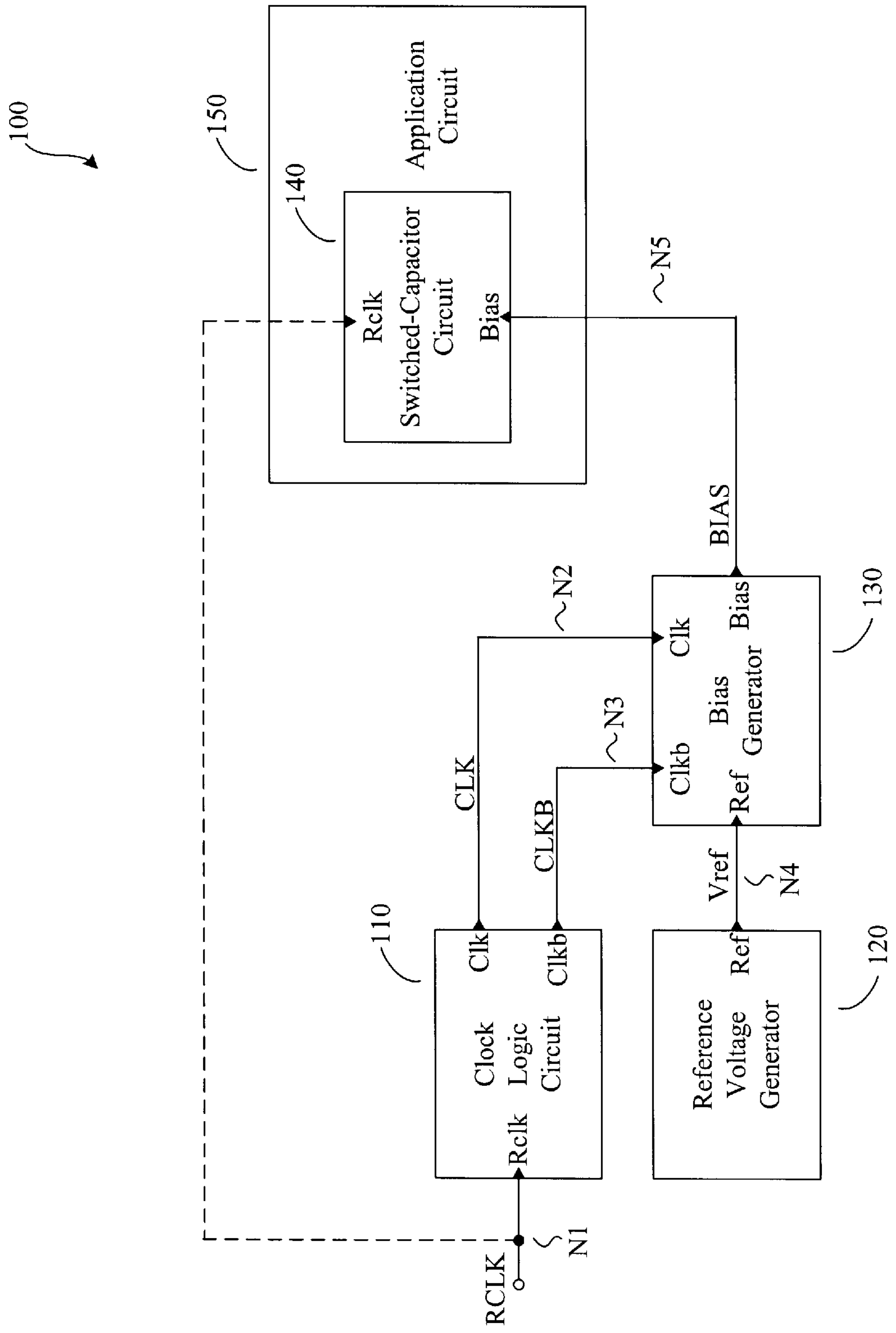
FIG. 1 illustrates an exemplary operating environment for a bias generator with an output current dependent upon clock frequency.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal.

The present invention is directed to an apparatus and method for a bias generator that produces a current that is controlled by a frequency of a reference clock signal. The frequency dependence of the current for the bias generator causes the current to change as the period of a reference clock changes. Often circuits are designed to operate up to some maximum clock speed. If a system uses the circuit at a lower speed than the maximum clock speed, the circuit is over designed. Specifically, the circuit will draw more power than is required for the lower actual clock speed. In integrated circuits (ICs), quiescent current is often the dominant power draw for the circuit. The frequency dependent current of the present invention minimizes power dissipation in a circuit by reducing the bias current as the frequency of the reference clock signal is reduced.

In generating a frequency dependent bias current, a ripple in the signal may occur. The present invention includes two capacitors that are selectively activated in an out-of-phase manner to produce a scaled bias current with minimum ripple. In addition, a ripple filter can be used to further reduce the ripple in the bias current. The multiple capacitor arrangement reduces ripple while permitting a ripple filter of minimum size.

In addition, the capacitors within the bias generator can be arranged to match the capacitors within a switched capacitor circuit. The capacitors in the bias generator can also be constructed of the same type of material as those within the switched-capacitor circuit. Matching the materials of the capacitive circuits in the bias generator to those of the switched-capacitor circuit ensures that process variations in the capacitive circuits (i.e., variations in the capacitance values for the capacitive circuits) affect both circuits similarly.

FIG. 1 illustrates an exemplary operating environment for a bias generator with an output current dependent upon clock frequency in accordance with the present invention. The operating environment (100) includes a clock logic circuit (110), a reference voltage generator (120), a bias generator (130), and an application circuit (150). In this example, the application circuit (150) includes a switched capacitor circuit (140).

The clock logic circuit (110) has an input port (Rclk) that is coupled to a first node (N1), a first output port (Clk) that is coupled to a second node (N2), and a second output port (Clkb) that is coupled to a third node (N3). The reference voltage generator (120) has an output port (Ref) that is coupled to a fourth node (N4). The bias generator (130) has a first input port (Ref) that is coupled to the fourth node (N4), a second input port (Clk) that is coupled to the second node (N2), a third input port (Clkb) that is coupled to the third node (N3), and an output port (Bias) that is coupled to a fifth node (N5). The switched capacitor circuit (140) has a first input port (Bias) that is coupled to the fifth node (N5), and a second input port (Rclk) that is optionally coupled to the first node (N1). For example, the application circuit (150) may contain other electronic circuits such as operational amplifiers, comparators, as well as other circuits that require biased current sources. The present invention is not limited to switched capacitor circuits, and may be employed to reduce power consumption in other circuits. By reducing the operating current with a controlled bias, the overall power consumption in these other circuits may also be reduced.

During operation, a reference clock signal (RCLK) is coupled to the first node (N1). The clock logic circuit (110) produces a clock signal (CLK) at the second node (N2) and an inverse clock signal (CLKB) at the third node (N3) in response to the reference clock signal (RCLK). The reference voltage generator (120) produces a reference voltage (Vref) at the fourth node (N4). The bias generator (130) produces a bias signal (BIAS) in response to the reference voltage (Vref), the clock signal (CLK), and the inverse clock signal (CLKB). The bias signal (BIAS) establishes a current used by the switched capacitor circuit (140) that is dependant upon the frequency of the reference clock signal (RCLK). Often, the same reference clock signal (RCLK) or a multiple or sub-multiple of the reference clock signal (RCLK) is used by the switched capacitor circuit (140). The switched capacitor circuit (140) uses the frequency dependant current and the reference clock signal (RCLK) to operate according to its function within the application circuit (150).

Figure 2:
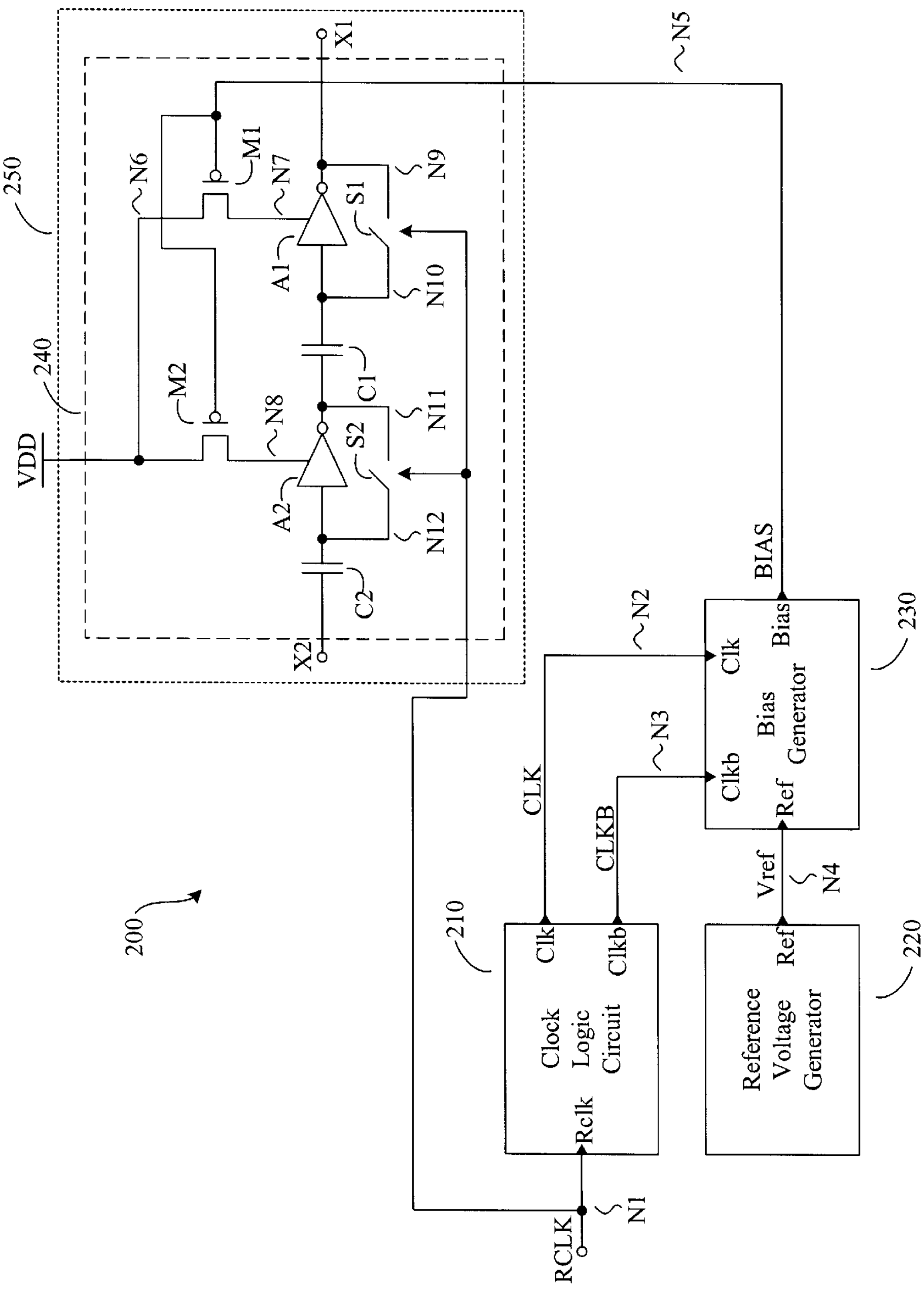
FIG. 2 illustrates another exemplary operating environment for the present invention.

FIG. 2 illustrates another exemplary operating environment for the present invention. The operating environment (200) includes a clock logic circuit (210), a reference voltage generator (220), a bias generator (230), and an application circuit (250). The application circuit (250) includes a switched capacitor circuit (240). The switched capacitor circuit (240) includes two PMOS transistors (M1, M2), two inverting amplifiers (A1, A2), two capacitors (C1, C2), and two switches (S1, S2).

The exemplary operating environment (200) is similar to the exemplary operating environment (100) shown in FIG. 1 with a switched capacitor circuit (240) shown in greater detail. The clock logic circuit (210) has an input port (Rclk) that is coupled to a first node (N1), a first output port (Clk) that is coupled to a second node (N2), and a second output port (Clkb) that is coupled to a third node (N3). The reference voltage generator (220) has an output port (Ref) that is coupled to a fourth node (N4). The bias generator (230) has a first input port (Ref) that is coupled to the fourth node (N4), a second input port (Clk) that is coupled to the second node (N2), a third input port (Clkb) that is coupled to the third node (N3), and an output port (Bias) that is coupled to a fifth node (N5).

In the switched capacitor circuit (240), a first PMOS transistor (M1) has a source that is coupled to the sixth node (N6), a drain that is coupled to a seventh node (N7), and a gate that is coupled to the fifth node (N5). A second PMOS transistor (M2) has a source that is coupled to the sixth node (N6), a drain that is coupled to an eighth node (N8), and a gate that is coupled to a fifth node (N5). A first port (X1) of the application circuit (250) is coupled to a ninth node (N9). A first inverting amplifier (A1) has an input that is coupled to a tenth node (N10), an output that is coupled to the ninth node (N9), and receives a current from the seventh node (N7). A second inverting amplifier (A2) has an input that is coupled to a twelfth node (N12), an output that is coupled to an eleventh node (N11), and receives a current from the eighth node (N8). A first capacitor (C1) is coupled in series between the tenth node (N10) and the eleventh node (N11). A second capacitor (C2) is coupled in series between a second port (X2) to the application circuit (250) and the twelfth node (N12). A first switch (S1) is coupled in series between the ninth node (N9) and the tenth node (N10). A second switch (S2) is coupled in series between the eleventh node (N11) and the twelfth node (N12). The first and second switches (S1, S2) are responsive to the reference clock signal (RCLK).

During operation, a power source (VDD) is coupled to the sixth node (N6). A reference clock signal (RCLK) is coupled to the first node (N1). The switched capacitor circuit (240) receives the bias signal (BIAS) at the fifth node (N5). The two PMOS transistors (M1, M2) are proportional to the devices (not shown) contained in the bias generator (230). The PMOS transistors (M1, M2) use the bias signal (BIAS) to mirror a frequency dependant current that is produced by the bias generator (230). The current is mirrored at the drain of each PMOS transistor (M1, M2). The operating current of the inverting amplifiers (A1, A2) is limited by transistors (M1, M2). The switches (S1, S2) are closed and opened according to the logic level of the reference clock signal (RCLK). The switching in the switched capacitor circuit (240) is controlled by the reference clock signal (RCLK). The reference clock signal (RCLK) is also the timing signal used to produce the bias signal (BIAS). In the exemplary switched capacitor circuit (240) shown, the higher the frequency of the reference clock signal (RCLK), the less time the amplifiers (A1, A2) have to charge the capacitors (C1, C2). The rate of charge is dependant upon the current delivered to the amplifiers (A1, A2). For the present invention, the current delivered to the amplifiers is dependant upon the frequency of the reference clock signal (RCLK). Therefore, as the frequency of the reference clock signal (RCLK) increases, the current delivered to the amplifiers (A1, A2) increases. The current is therefore a function of the reference clock signal (RCLK) frequency. Using the bias generator (230) of the present invention in concert with the switched capacitor circuit (240) provides scalable power consumption with changes in frequency.

In light of the discussion above, it is understood and appreciated that any switched capacitor circuit (240) can be substituted for the example illustrated in FIG. 2. For example, switched capacitor circuits are associated with certain types of analog-to-digital converters (ADC's). The bias generator (230) can be used to produce the frequency dependant current for the switched capacitor circuit contained within an ADC. It is therefore also appreciated, that the application circuit (250) can be any circuit that contains a switched capacitor arrangement, including but not limited to certain ADC's, filters, and other types of circuits.

Figure 3:
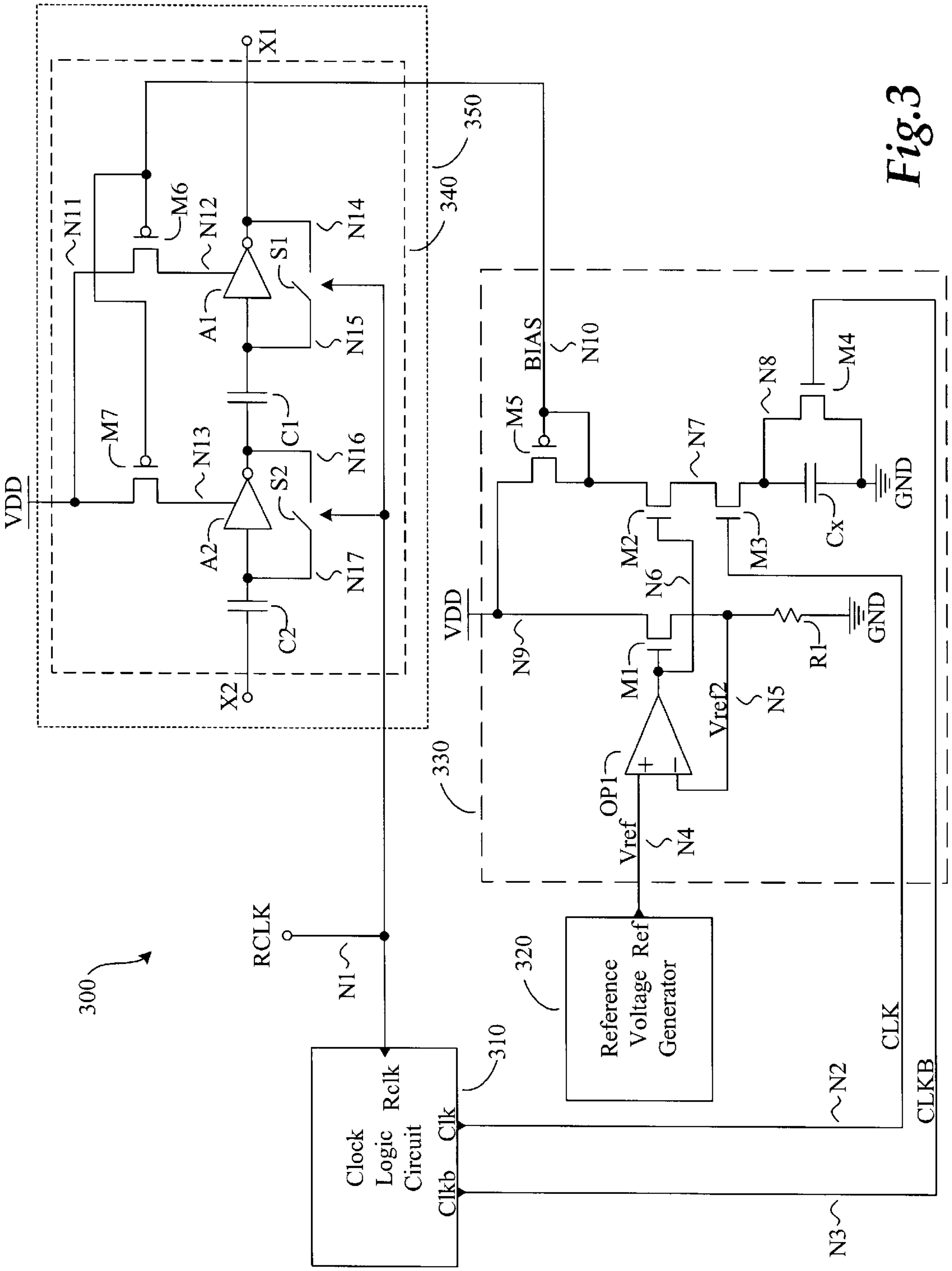
FIG. 3 illustrates a schematic diagram of a bias generator circuit in accordance with the present invention.

FIG. 3 illustrates a schematic diagram (300) of a bias generator circuit that is in accordance with the present invention. The schematic diagram (300) includes a clock logic circuit (310), a reference voltage generator (320), a bias generator (330), and an application circuit (350) that includes a switched capacitor circuit (340). The bias generator (330) includes an op-amp (OP1), four NMOS transistors (M1–M4), a PMOS transistor (M5), a resistor (R1), and a capacitor (Cx). The switched capacitor circuit (340) includes two PMOS transistors (M6, M7), two inverting amplifiers (A1, A2), two capacitors (C1, C2), and two switches (S1, S2).

The schematic diagram (300) shown in FIG. 3 is arranged similar to the operating environment (200) shown in FIG. 2. The clock logic circuit (310) has an input port (Rclk) that is coupled to a first node (N1), a first output port (Clk) that is coupled to a second node (N2), and a second output port (Clkb) that is coupled to a third node (N3). The reference voltage generator (320) has an output port (Ref) that is coupled to a fourth node (N4).

In the bias generator (330), the op-amp (OP1) has a non-inverting input that is coupled to a fourth node (N4), an inverting input that is coupled to a fifth node (N5), and an output coupled to a sixth node (N6). The first NMOS transistor (M1) has a source coupled to the fifth node (N5), a drain that is coupled to the ninth node (N9), and a gate that is coupled to the sixth node (N6). The second NMOS transistor (M2) has a source that is coupled to a seventh node (N7), a drain that is coupled to a tenth node (N10), and a gate that is coupled to the sixth node (N6). The third NMOS transistor (M3) has a source that is coupled to an eighth node (N8), a drain that is coupled to the seventh node (N7), and a gate that is coupled to the second node (N2). The fourth NMOS transistor (M4) has a drain that is coupled to the eighth node (N8), a source that is coupled to a ground terminal (GND), and a gate that is coupled to the third node (N3). The PMOS transistor (M5) has a drain that is coupled to the ninth node (N9), and a gate and source that are coupled to the tenth node (N10). A resistor (R1) is coupled in series between the fifth node (N5) and the ground terminal (GND). The capacitor (Cx) is coupled in series between the eighth node (N8) and the ground terminal (GND).

In the switched capacitor circuit (340), a second PMOS transistor (M6) has a source that is coupled to the eleventh node (N11), a drain that is coupled to a twelfth node (N12), and a gate that is coupled to the tenth node (N10). A third PMOS transistor (M7) has a source that is coupled to the eleventh node (N11), a drain that is coupled to a thirteenth node (N13), and a gate that is coupled to the tenth node (N10). A first port (X1) of the application circuit (350) is coupled to a fourteenth node (N14). A first inverting amplifier (A1) has an input that is coupled to a fifteenth node (N15) an output that is coupled to the fourteenth node (N14), and receives a current from the twelfth node (N12). A second inverting amplifier (A2) has an input that is coupled to a seventeenth node (N17), an output that is coupled to a sixteenth node (N16), and receives a current from the thirteenth node (N13). A first capacitor (C1) is coupled in series between the fifteenth node (N15) and the sixteenth node (N16). A second capacitor (C2) is coupled in series between a second port (X2) to the application circuit (350) and the seventeenth node (N17). A first switch (S1) is coupled in series between the fourteenth node (N14) and the fifteenth node (N15). A second switch (S2) is coupled in series between the sixteenth node (N16) and the seventeenth node (N17). The first and second switches (S1, S2) are responsive to the reference clock signal (RCLK).

The application circuit (350) shown in FIG. 3 operates similar to the application circuit (250) illustrated in FIG. 2. The switched capacitor circuit (340) also operates similar to the switched capacitor circuit (240) shown in FIG. 2.

During operation, a power source (VDD) is coupled to the ninth node (N9) and the eleventh node (N11). The bias generator (330) receives a reference voltage (reference potential, Vref) from the reference voltage generator (320). The op-amp (OP1) operates as a control circuit that produces a control signal in response to the reference voltage (Vref). The op-amnp (OP1) senses a potential (Vref2) at the fifth node (N5) and adjusts the potential (Vref2) until it equals the reference voltage (Vref). By matching the potential (Vref2) with the reference voltage (Vref), a constant potential is established at the source of NMOS transistor M1 across the resistor (R1). It is appreciated however, that any passive or active circuit capable of establishing a current can be used in substitution for resistor R1.

The bias generator (330) also receives a clock signal (CLK) and an inverse clock signal (CLKB) from the clock logic circuit (310). When the clock signal (CLK) is a high logic level ("1") the inverse clock signal (CLKB) is a low logic level ("0"). Similarly, when the clock signal (CLK) is a low logic level ("0") the inverse clock signal (CLKB) is a high logic level ("1"). It is appreciated that the clock logic circuit (310) can also produce the clock signal (CLK) and inverse clock signal (CLKB) such that they are non-overlapping signals. Using non-overlapping signals ensures that only a single capacitor (e.g., Cx) is coupled to NMOS transistor M2 at a particular time. This isolates the charging phase of each capacitor (e.g., Cx), such that each capacitor (e.g., Cx) is separately coupled to the only current path for the charging current through NMOS transistor M2.

NMOS transistor M3 and NMOS transistor M4 are arranged to operate as switches that are actuated by the clock signal (CLK) and the inverse clock signal (CLKB) respectively. Therefore, when the clock signal (CLK) is at the high logic level ("1"), NMOS transistor M3 operates as a closed switch and NMOS transistor M4 operates as an open switch.

The capacitor (Cx) is charged by the current that is received through NMOS transistor M3 from NMOS transistor M2 when the clock signal (CLK) is at the high logic level ("1"). NMOS transistor M2, op-amp (OP1), and NMOS transistor M1, together operate as a controlled current circuit that is arranged to produce a charging current to charge the capacitor (Cx). The second transistor (M2) shares a common gate connection with the first NMOS transistor (M1). As stated previously, the first transistor (M1) is arranged to provide a source voltage (the potential at node N5) corresponding to the reference voltage (Vref). Transistor M1 operates as a controlled circuit that enables the op-amp (OP1) to regulate the potential at the fifth node (N5). Since the second NMOS transistor (M2) shares a common gate connection with the first transistors (M1), transistor M2 will pull the potential at the seventh node (N7) (and the potential at the eighth node (N8) when NMOS transistor M3 is closed) to the reference voltage (Vref). The seventh node (N7) operates as a sense node that has a sense potential that is different from the reference voltage (Vref). When NMOS transistor M3 is closed, the seventh node is coupled to the capacitor (Cx). NMOS transistor M2 "senses" that the potential at the seventh node (N7) is different from the reference voltage (Vref) such that a current is delivered to the seventh node (N7). The capacitor (Cx) charges until the potential across the capacitor (Cx), which corresponds to the sense potential, reaches the reference voltage (Vref), or until the switch formed by NMOS transistor M3 is deactivated operating as an open switch.

The capacitor (Cx) is initially discharged to ground before the next clock period is initiated by the rising edge of the clock signal (CLK). The rising edge of the clock signal (CLK) activates NMOS transistor M3, which operates as a closed switch, and couples the source of NMOS transistor M2 to the capacitor at node N8. Since the capacitor (Cx) is initially discharged and the gate of NMOS transistor M2 is biased at a substantially constant voltage, NMOS transistor M2 is biased into saturation ($V_{GS}-V_T<V_{DS}$) such that charge is transferred to the capacitor (Cx) and the potential across the capacitor (Cx) begins to increase. As the potential of the capacitor (Cx) continues to increase, the source potential of NMOS transistor M2 begins to approach the reference voltage (Vref), and current flowing through the drain of NMOS transistor M2 decreases since NMOS transistor M2 moves out of saturation and into the non-saturated (linear) operating region ($V_{GS}-V_T>V_{DS}$). Once the potential across the capacitor (Cx) substantially reaches the reference voltage (Vref), current stops flowing through the drain of the NMOS transistor (M2) since the corresponding gate-source voltage reaches cutoff ($V_{GS}-V_T=0$). It is appreciated that the above discussion provides a simplified first-order circuit model description. However second order effects may also apply such as sub-threshold conduction.

When the clock signal (CLK) transitions to a low logic level, NMOS transistor M3 operates as an open switch, and NMOS transistor M4 operates as closed switch. While NMOS transistor M4 is active, the capacitor (Cx) is discharged to ground. The capacitor (Cx) will remain discharged until the start of the next clock period when the clock signal (CLK) transitions to the high logic level ("1"). At the edges of the clock signal (CLK) and the inverse clock signal (CLKB) NMOS transistors M3 and M4 are selectively activated and deactivated operating as switches. In some instances, noise associated with the switching of NMOS transistors M3 and M4 may couple to node N6. It is appreciated that a capacitor (not shown) or other noise reduction circuit can be arranged to reduce the switching noise associated with NMOS transistors M3 and M4, preventing the switching noise from feeding back into the sixth node (N6).

From the discussion above, it is appreciated that the bias generator (330) has two operational phases, a charging phase and a discharging phase. The duration of each phase is determined by the frequency of the clock signal (CLK) and the inverse clock signal (CLKB). The clock signal (CLK) and the inverse clock signal (CLKB) are produced from the reference clock signal (RCLK). With higher frequencies in the reference clock signal (RCLK), the length of each phase is shortened. As discussed previously, NMOS transistor M2 produces a charging current that is used to charge the capacitor (Cx) to the reference voltage (Vref), where the charging current decreases as the potential across the capacitor increases. The capacitor (Cx) charges to the reference voltage (Vref) over a charging time that is independent of the frequency of the clock signals (CLK, CLKB). When the charging time of the capacitor (Cx) is less than the pulse-width of the clock signal (CLK), an average current is produced by NMOS transistor M2 that is linearly related to the clock signal (CLK). However, when the charging time of the capacitor (Cx) is longer than the pulse-width of the clock signal (CLK), the capacitor (Cx) will not charge to the full reference voltage (Vref), resulting in a current that tracks the clock frequency in a non-linear manner.

PMOS transistor M5 operates as an averaging circuit that is arranged to produce the bias signal (BIAS) in response to the average of the charging current. PMOS transistor M5 is a diode connected transistor device that is in series with the drain of NMOS transistor M2. PMOS transistor M5 conducts the average of the charging current that is flowing through NMOS transistor M2 over a single clock period. A diode voltage that corresponds to the charging current appears across the drain and source of PMOS transistor M5 when active. Since PMOS transistor M5 is in series with NMOS transistor M2, PMOS transistor M5 is active when NMOS transistor M2 is active. Thus, the diode voltage of PMOS transistor M5 is also related to the frequency of the clock signal (CLK). PMOS transistor M5 includes an inherent gate capacitance that will store charge while the transistor is active, providing a smoothing (averaging) function to the diode voltage. Additional circuitry (not shown) may be added to the circuit to provide further averaging of the diode voltage. The average diode voltage of PMOS transistor M5 provides a biasing signal (BIAS) that is related to the average current which is determined by the clock frequency.

PMOS transistors M6–M7 in the switched capacitor circuit (340) have common gate and source connections with PMOS transistor M5 such that they form current mirrors that are biased by the biasing signal (BIAS). Thus, PMOS transistors M6 and M7 operate as current sources that provide currents that are proportional to the clock frequency (CLK). It is appreciated that the frequency dependent currents may not maintain a linear relationship with the frequency of the reference clock signal. As the frequency increases, the capacitor (Cx) has less time to charge to the potential established at the seventh node (N7) (e.g., Vref). Eventually, the frequency is increased to the level that the capacitor (Cx) can no longer charge to the reference voltage (Vref) during a single operational phase. The frequency dependent current will continue to increase as the frequency of the reference clock signal (RCLK) increases, but at a slower rate. The frequency to current relationship is no longer linear at high frequencies.

The capacitors (C1, C2) in the switched capacitor circuit (340) are the same type as the capacitors (Cx) in the bias generator (330). Changes in the capacitance values of the capacitors (Cx, C1, C2) may occur due to process variations. The capacitors in the switched capacitor circuit are often the dominant load on the amplifiers. In the exemplary switch capacitor circuit (340), an increase in the capacitance values of the capacitors (C1, C2) increases the requirement for current delivered by the amplifiers (A1, A2). Capacitor Cx in the bias generator (330) is the same type of capacitor as capacitors C1 and C2 such that processing variations in the capacitance values will track each other. Increases in the capacitance value for capacitor Cx in the bias generator (330) will result in increased frequency dependent current that is mirrored to the switched capacitor circuit (340). Thus, for process variations where the capacitors (Cx, C1, C2) increase in size, the increased current provided by the bias generator (230) allows the amplifiers A1 and A2 to drive the load presented by capacitors C1 and C2 within the switching times of the switched capacitor circuit (340).

In light of the discussion above, it is appreciated and understood that the clock signal (CLK) and inverse clock signal (CLKB) can also be divided from the reference clock signal (RCLK) to allow more time to charge and discharge capacitor Cx in producing the frequency dependant current. In one example the clock signal (CLK) and the inverse clock signal (CLKB) are half the frequency of the reference clock signal (RCLK).

It is also appreciated that in a preferred embodiment, the reference voltage (Vref) is a voltage that is independent of temperature variations, such as a band-gap reference voltage. The arrangement of the bias generator (330) produces a control signal at node N6 that will compensate for temperature variations in NMOS transistor M1. Since the reference voltage (Vref) is independent of temperature, the control signal will ensure the potential at node N7 is independent of temperature variations in NMOS transistor M2. Since the capacitor (Cx) has a relatively low temperature coefficient, the bias generator (330) should also be independent of temperature. The insensitivity of the bias generator (330) ensures that no temperature effects are introduced into the bias generator (330). Thus, the bias generator (330) maintains the temperature characteristics of the reference voltage (Vref).

Figure 4:
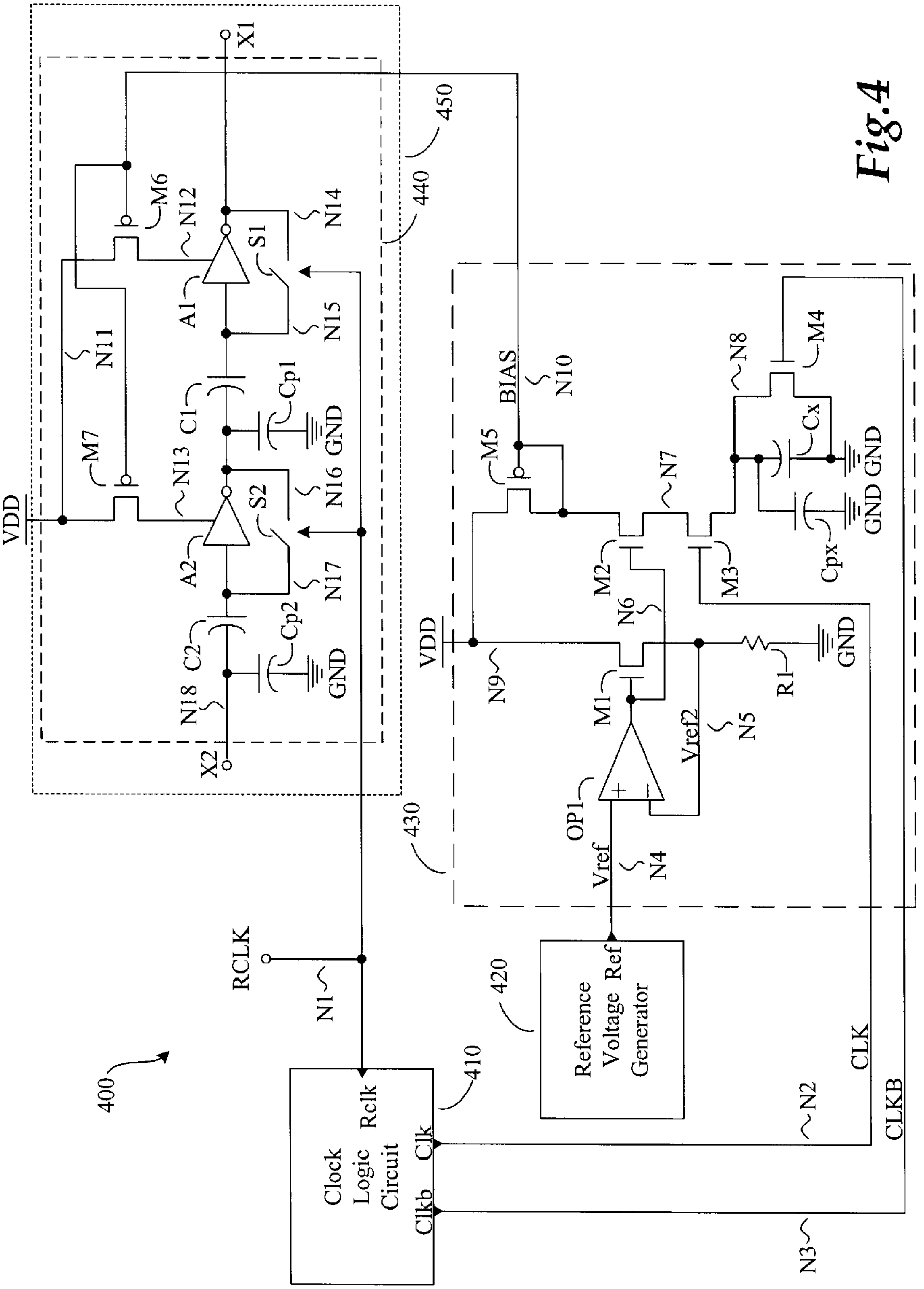
FIG. 4 illustrates an exemplary schematic diagram of the bias generator illustrating parasitic effects on the capacitors.

FIG. 4 illustrates an exemplary schematic diagram of the bias generator illustrating parasitic effects on the capacitors. The schematic diagram (400) includes a clock logic circuit (410), a reference voltage generator (420), a bias generator (430), and a switched capacitor circuit (440) in an application circuit (450). The bias generator (330) includes an op-amp (OP1), four NMOS transistors (M1–M4), a PMOS transistor (M5), a resistor (R1), and two capacitors (Cx, Cpx). The switched capacitor circuit (340) includes two PMOS transistors (M6, M7), two inverting amplifiers (A1, A2), four capacitors (C1, Cp1, C2, Cp2), and two switches (S1, S2).

The schematic diagram (400) is connected similar to the schematic diagram (300) shown in FIG. 3 with orientation and parasitic effects of the capacitors are shown in greater detail. The clock logic circuit (410) has an input port (Rclk) that is coupled to a first node (N1), a first output port (Clk) that is coupled to a fourth node (N4), and a second output port (Clkb) that is coupled to a third node (N3). The reference voltage generator (420) has an output port (Ref) that is coupled to a second node (N2). A reference clock signal (RCLK) is coupled to a first node (N1).

In the bias generator (430), the op-amp (OP1) has a non-inverting input that is coupled to a fourth node (N4), an inverting input that is coupled to a fifth node (N5), and an output coupled to a sixth node (N6). A first NMOS transistor (M1) has a source coupled to the fifth node (N5), a drain that is coupled to the ninth node (N9), and a gate that is coupled to the sixth node (N6). A second NMOS transistor (M2) has a source that is coupled to a seventh node (N7), a drain that is coupled to a tenth node (N10), and a gate that is coupled to the sixth node (N6). A third NMOS transistor (M3) has a source that is coupled to an eighth node (N8), a drain that is coupled to the seventh node (N7), and a gate that is coupled to the second node (N2). A fourth NMOS transistor (M4) has a drain that is coupled to the eighth node (N8), a source that is coupled to a ground terminal (GND), and a gate that is coupled to the third node (N3). The PMOS transistor (M5) has a drain that is coupled to the ninth node (N9), and a gate and source that are coupled to the tenth node (N10). A resistor (R1) is coupled in series between the fifth node (N5) and the ground terminal (GND). A capacitor (Cx) is coupled in series between the eighth node (N8) and the ground terminal (GND). Capacitor (Cx) has an associated parasitic capacitance (Cpx) that is coupled between the eighth node (N8) and the ground terminal (GND).

In the switched capacitor circuit (440), VDD is coupled to an eleventh node (N11). A second PMOS transistor (M6) has a source that is coupled to the eleventh node (N11), a drain that is coupled to a twelfth node (N12), and a gate that is coupled to the tenth node (N10). A third PMOS transistor (M7) has a source that is coupled to the eleventh node (N11), a drain that is coupled to a thirteenth node (N13), and a gate that is coupled to the tenth node (N10). A first port (X1) of the application circuit (450) is coupled to a fourteenth node (N14). A first inverting amplifier (A1) has an input that is coupled to a fifteenth node (N15) an output that is coupled to the fourteenth node (N14), and receives a current from the twelfth node (N12). A second inverting amplifier (A2) has an input that is coupled to a seventeenth node (N17), an output that is coupled to a sixteenth node (N16), and receives a current from the thirteenth node (N13). A first capacitor (C1) is coupled in series between the fifteenth node (N15) and the sixteenth node (N16). Capacitor C1 has an associated parasitic capacitor (Cp1) that occurs between the sixteenth node (N16) and the ground terminal (GND). A second capacitor (C2) is coupled in series between the seventeenth node (N17) and the eighteenth node (N18). Capacitor C1 has an associated parasitic capacitor (Cp2) that occurs between the eighteenth node (N18) and the ground terminal (GND). A second port (X2) of the application circuit (450) is coupled to the eighteenth node (N18). A first switch (S1) is coupled in series between the fourteenth node (N14) and the fifteenth node (N15). A second switch (S2) is coupled in series between the sixteenth node (N16) and the seventeenth node (N17). The first and second switches (S1, S2) are responsive to the reference clock signal (RCLK).

The circuit (400) shown in FIG. 4 operates similar to the circuit illustrated in FIG. 3. In FIG. 4, the orientation and parasitic effects of the capacitors are shown in greater detail. In one example, the electronic circuit is implemented as an integrated circuit including "on-chip" capacitors that have inherent parasitic capacitances associated therewith. In this instance, the type and orientation of the electronic circuit capacitor (Cx) should match the switched capacitor circuit capacitors (C1, C2) such that parasitic effects track one another. Each parasitic capacitor (Cpx, Cp1, CP2) shown in both the bias generator (330) and the switched capacitor circuit (340) is formed between the bottom plate of the capacitor and substrate. The capacitance values of the parasitic capacitors (Cpx, Cp1, Cp2) constitute a higher percentage of the total capacitance when the capacitors (Cx, C1, C2) have low capacitance values. In the present invention, the capacitor (Cx) in the bias generator (430) is oriented and sized to match the orientation and size of the capacitors (C1, C2) in the switched capacitor circuit (440). By matching the size and orientation, the effects of the parasitic capacitances on the switched capacitor circuit (340) and the bias generator (330) are proportional to one another. For example, amplifier A1 is arranged to drive the bottom plate of capacitor C2 in the switched capacitor circuit (340), and NMOS transistor M2 is arranged to drive the bottom plate of capacitor Cx. The amount of contribution by the parasitic capacitance (Cpx) in the bias generator (430) is proportional to the contribution of the parasitic capacitances (Cp1, Cp2) in the switched capacitor circuit (440) despite changes in process variations of the capacitors (Cx, C1, C2) and their corresponding parasitic capacitors (Cpx, Cp1, Cp2).

Figure 5:
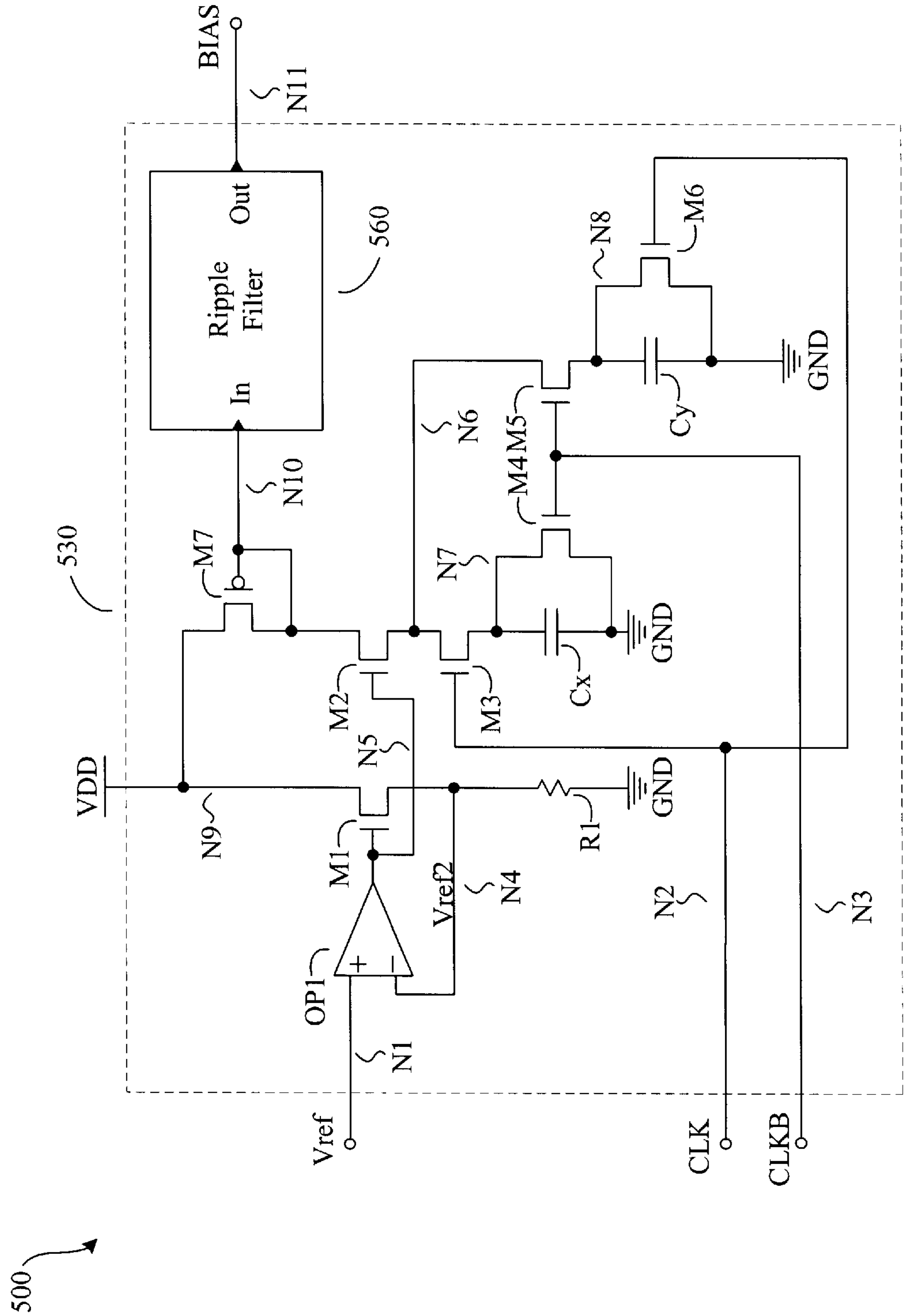
FIG. 5 illustrates an exemplary schematic diagram of the bias generator with output current dependent upon clock frequency with additional ripple suppression.

FIG. 5 illustrates another exemplary schematic diagram in accordance with the present invention. A bias generator (530) includes an op-amp (OP1), six NMOS transistors (M1–M6), a PMOS transistor (M7), a resistor (R1), two capacitors (Cx, Cy), and a ripple filter (560).

The op-amp (OP1) has a non-inverting input that is coupled to a first node (N1), an inverting input that is coupled to a fourth node (N4), and an output that is coupled to a fifth node (N5). The first NMOS transistor (M1) has a source that is coupled to the fourth node (N4), a drain that is coupled to a ninth node (N9), and a gate that is coupled to the fifth node (N5). The second NMOS transistor (M2) has a source that is coupled to a sixth node (N6), a drain that is coupled to a tenth node (N10), and a gate that is coupled to the fifth node (N5). The third NMOS transistor (M3) has a source that is coupled to a seventh node (N7), a drain that is coupled to the sixth node (N6), and a gate that is coupled to a second node (N2). The fourth NMOS transistor (M4) has a drain that is coupled to the seventh node (N7), a source that is coupled to a ground terminal (GND), and a gate that is coupled to a third node (N3). A first capacitor (Cx) is coupled in series between the seventh node (N7) and the ground terminal (GND). The fifth NMOS transistor (M5) has a drain that is coupled to the sixth node (N6), a source that is coupled to an eighth node (N8), and a gate that is coupled to the third node (N3). The sixth NMOS transistor (M6) has a drain that is coupled to the eighth node (N8), a source that is coupled to the ground terminal (GND), and a gate that is coupled to the second node (N2). A second capacitor (Cy) is coupled in series between the eighth node (N8) and the ground terminal (GND). The PMOS transistor (M7) has a drain that is coupled to the ninth node (N9), and a gate and source that are coupled to the tenth node (N10). The ripple filter (560) has an input port (In) coupled to the tenth node (N10) and an output port (Out) coupled to an eleventh node (N11). A resistor (R1) is coupled in series between the fourth node (N4) and the ground terminal (GND).

During operation, a power source (VDD) is coupled to the ninth node (N9). The bias generator (500) receives a reference voltage (Vref) from an external reference voltage circuit (not shown). The op-amp (OP1) operates as a control circuit that produces a control signal in response to the reference voltage (Vref). The op-amp (OP1) senses a potential (Vref2) at the fourth node (N4) and adjusts the potential (Vref2) until it equals the reference voltage (Vref). By matching the potential (Vref2) with the reference voltage (Vref), a constant potential is established at it the source of NMOS transistor M1 across the resistor (R1). Transistor M1 operates as a controlled circuit that enables the op-amp (OP1) to regulate the potential at the fourth node (N4). It is appreciated however, that any passive or active circuit capable of establishing a current can be used in substitution for resistor R1.

The bias generator (500) also receives a clock signal (CLK) and an inverse clock signal (CLKB). When the clock signal (CLK) is a high logic level ("1") the inverse clock signal (CLKB) is a low logic level ("0"). Similarly, when the clock signal (CLK) is a low logic level ("0") the inverse clock signal (CLKB) is a high logic level ("1"). It is appreciated that the clock signal (CLK) and inverse clock signal (CLKB) can be produced such that they are non-overlapping signals. Using non-overlapping signals ensures that only a single capacitor (e.g., Cx) is coupled to NMOS transistor M2 at a particular time. This isolates the charging phase of each capacitor (e.g., Cx), such that each capacitor (e.g., Cx) is separately coupled to the only current path for the charging current through NMOS transistor M2.

NMOS transistors M3–M6 are arranged to operate as switches that are actuated by the clock signal (CLK) and the inverse clock signal (CLKB). NMOS transistors M3 and M6 are actuated by the clock signal (CLK), while NMOS transistors M4 and M5 are actuated by the inverse clock signal (CLKB). For example, when the clock signal (CLK) is at the high logic level ("1"), NMOS transistors M3 and M6 operate as closed switches and NMOS transistors M4 and M5 operate as open switches. It is appreciated that the logic levels corresponding to the operational state of the NMOS transistors (M3–M6) can be any logic level that results in the complimentary out-of-phase operation as described above.

The capacitors (Cx, Cy) are charged by the current that is provided by NMOS transistor M2 during their respective charging phases. NMOS transistor M2, op-amp (OP1), and NMOS transistor M1, together operate as a controlled current circuit that is arranged to produce a charging current to charge the capacitors (Cx, Cy). Capacitor Cx charges during a first phase when the clock signal (CLK) is a high logic level ("1") and NMOS transistor M3 operates as a closed switch. Capacitor Cy charges during a second phase when the inverse clock signal (CLKB) is a high logic level ("1") and NMOS transistor M5 operates as a closed switch. The second transistor (M2) shares a common gate connection with the first NMOS transistor (M1). As stated previously, the first transistor (M1) is arranged to provide a source voltage (the potential at node N4) corresponding to the reference voltage (Vref). Since the second NMOS transistor (M2) shares a common gate connection with the first transistors (M1), transistor M2 will pull the potential at the sixth node (N6) to the reference voltage (Vref). The sixth node (N6) operates as a sense node that has a sense potential that is different from the reference voltage (Vref). When NMOS transistor M3 is closed, the seventh node is coupled to the capacitor (Cx). NMOS transistor M2 "senses" that the potential at the sixth node (N6) is different from the reference voltage (Vref) such that a current is delivered to the sixth node (N6). Thus, a selected capacitor (Cx, Cy) is charged until the potential across the selected capacitor (Cx, Cy), which corresponds to the sensed potential, reaches the reference voltage (Vref), or until the NMOS transistor (M3, M5) coupled to the selected capacitor (Cx, Cy) is actuated as an open switch.

The first capacitor (Cx) is initially discharged to ground before a next charging period for the first capacitor (Cx) is initiated by the rising edge of the clock signal (CLK). The rising edge of the clock signal (CLK) activates NMOS transistor M3, which operates as a closed switch, and couples the source of NMOS transistor M2 to the capacitor at node N7. Since the first capacitor (Cx) is initially discharged and the gate of NMOS transistor M2 is biased at a substantially constant voltage, NMOS transistor M2 is biased into saturation ($V_{GS}-V_T<V_{DS}$) such that charge is transferred to the first capacitor (Cx) and the potential across the first capacitor (Cx) begins to increase. As the potential of the first capacitor (Cx) continues to increase, the source potential of NMOS transistor M2 begins to approach the reference voltage (Vref), and current flowing through the drain of NMOS transistor M2 decreases since NMOS transistor M2 moves out of saturation and into the non-saturated (linear) operating region ($V_{GS}-V_T>V_{DS}$). Once the potential across the first capacitor (Cx) substantially reaches the reference voltage (Vref), current stops flowing through the drain of the NMOS transistor (M2) since the corresponding gate-source voltage reaches cutoff ($V_{GS}-V_T=0$).

Similarly, the second capacitor (Cy) is initially discharged to ground before a next charging period for the second capacitor (Cy) is initiated by the rising edge of the inverse clock signal (CLKB). The rising edge of the inverse clock signal (CLKB) activates NMOS transistor M5, which operates as a closed switch, and couples the source of NMOS transistor M2 to the capacitor at node N8. Since the second capacitor (Cy) is initially discharged and the gate of NMOS transistor M2 is biased at a substantially constant voltage, NMOS transistor M2 is biased into saturation ($V_{GS}-V_T<V_{DS}$) such that charge is transferred to the second capacitor (Cy) and the potential across the second capacitor (Cy) begins to increase. As the potential of the second capacitor (Cy) continues to increase, the source potential of NMOS transistor M2 begins to approach the reference voltage (Vref), and current flowing through the drain of NMOS transistor M2 decreases since NMOS transistor M2 moves out of saturation and into the non-saturated (linear) operating region ($V_{GS}-V_T>V_{DS}$). Once the potential across the second capacitor (Cy) substantially reaches the reference voltage (Vref), current stops flowing through the drain of the NMOS transistor (M2) since the corresponding gate-source voltage reaches cutoff ($V_{GS}-V_T=0$).

When the clock signal (CLK) transitions to a low logic level, NMOS transistors M3 and M6 are deactivated, and NMOS transistors M4 and M5 are activated. While NMOS transistor M4 is activated it operates as a closed switch that discharges first capacitor (Cx) to ground. The first capacitor (Cx) will remain discharged until the start of the next clock period when the clock signal (CLK) transitions to the high logic level ("1"). When the clock signal (CLK) transitions to the high logic level, NMOS transistors M4 and M5 operate are deactivated, and NMOS transistors M3 and M6 are activated. While NMOS transistor M6 is activated it operates as a closed switch that discharges the second capacitor (Cy) to ground. The second capacitor (Cy) will remain discharged until the start of the next clock period when the clock signal (CLK) transitions to the low logic level. At the edges of the clock signal (CLK) and the inverse clock signal (CLKB) NMOS transistors M3–M6 are selectively activated and deactivated such that they operate as switches. In some instances, noise associated with the switching of NMOS transistors M3–M6 may couple to node N5. It is appreciated that a capacitor (not shown) or other noise reduction circuit can be arranged to reduce the switching noise associated with NMOS transistors M3–M6, preventing the switching noise from feeding back to the fifth node (N5).

From the discussion above, it is appreciated that the bias generator (430) has two operational phases, a first phase and a second phase. During the first phase, capacitor Cx is charged while capacitor Cy is discharged. During the second phase, capacitor Cx is discharged while capacitor Cy is charged. The duration of each phase is determined by the frequency of the clock signal (CLK) and the inverse clock signal (CLKB). The clock signal (CLK) and the inverse clock signal (CLKB) may be produced from the reference clock signal (RCLK) as illustrated in FIG. 4. With higher frequencies in the reference clock signal (RCLK), the length of each phase is shortened. As discussed previously, NMOS transistor M2 produces a charging current that is used to charge the capacitors (Cx, Cy) to the reference voltage (Vref) during their respective charging periods. The charging current decreases as the potential across the capacitor increases. The capacitors (Cx, Cy) charge to the reference voltage (Vref) over a charging time that is independent of the frequency of the clock signals (CLK, CLKB). When the charging time of the capacitors (Cx, Cy) is less than the pulse-width of the clock signal (CLK) or inverse clock signal (CLKB) respectively, an average current is produced by NMOS transistor M2 that is linearly related to the clock signal (CLK). However, when the charging time of the capacitors (Cx, Cy) is longer than the pulse-width of the clock signal (CLK) or inverse clock signal (CLKB), the capacitors (Cx, Cy) will not charge to the full reference voltage (Vref), resulting in a current that tracks the clock frequency in a non-linear manner.

PMOS transistor M7 operates as an averaging circuit that is arranged to produce the bias signal (BIAS) in response to the average of the charging current. PMOS transistor M7 is a diode connected transistor device that is in series with the drain of NMOS transistor M2. PMOS transistor M7 conducts the average of the charging current that is flowing through NMOS transistor M2 over a single clock period. A diode voltage that corresponds to the charging current appears across the drain and source of PMOS transistor M7 when active. Since PMOS transistor M7 is in series with NMOS transistor M2, PMOS transistor M7 is active when NMOS transistor M2 is active. Thus, the diode voltage of PMOS transistor M7 is also related to the frequency of the clock signal (CLK). PMOS transistor M7 includes an inherent gate capacitance that will store charge while the transistor is active, providing a smoothing (averaging) function to the diode voltage. Additional circuitry (not shown) may be added to the circuit to provide further averaging of the diode voltage. The average diode voltage of PMOS transistor M7 provides a biasing signal (BIAS) that is related to the average current which is determined by the clock frequency.

By using two capacitors (Cx, Cy) that are charged out-of-phase with respect to one another, ripple in the charging current is reduced. Ripple occurs when charging of capacitor Cx or capacitor Cy is initiated at the start of their respective charging phases. For example, when NMOS transistor M3 closes, conducting, charging current from NMOS transistor M2 is coupled into the capacitor (Cx). This charging current also flows through the gate of PMOS transistor M7. The charging current has ripple due to the sudden current drive resulting from the activation of NMOS transistor M2 in its saturation operating region. The charging current decreases through the linear operating region of NMOS transistor M2 until the charging current is terminated when NMOS transistor M2 reaches its cutoff operating region. The rise and fall in charging current is referred to as ripple in the current.

The charging time required to charge a capacitor to its full potential is related to the size of the capacitor and the charging current. A larger capacitor requires a larger charging current to charge to its full potential during the same charging time. By using two capacitors (Cx, Cy) that are charged out-of-phase with respect to one another, the capacitor sizes can be reduced. The transient time to charge each smaller capacitor is less than the transient time required to charge a larger capacitor. However, two out-of-phase capacitors that are half the size of a larger capacitor have the same average current as produced by the larger capacitor. The same average current results in the same bias signal (BIAS) for both the single large capacitor and the two half-sized, out-of-phase capacitors. However, ripple in the average current is reduced for the two smaller, out-of-phase capacitors as compared to ripple in the average current for a single large capacitor. NMOS transistor M2 conducts the charging current more often when using the two smaller, out-of-phase capacitors (Cx, Cy) as compared to using a single large capacitor. Since the diode connected device (M7) is conducting current twice as often as compared to a single capacitor, the amount and duration of the ripple in the average current and the corresponding bias signal (BIAS) is reduced. The ripple filter (560) further smoothes ripple in the bias signal (BIAS) by operating as an averaging or smoothing circuit that minimizes variations in the bias signal (BIAS).

Figure 6:
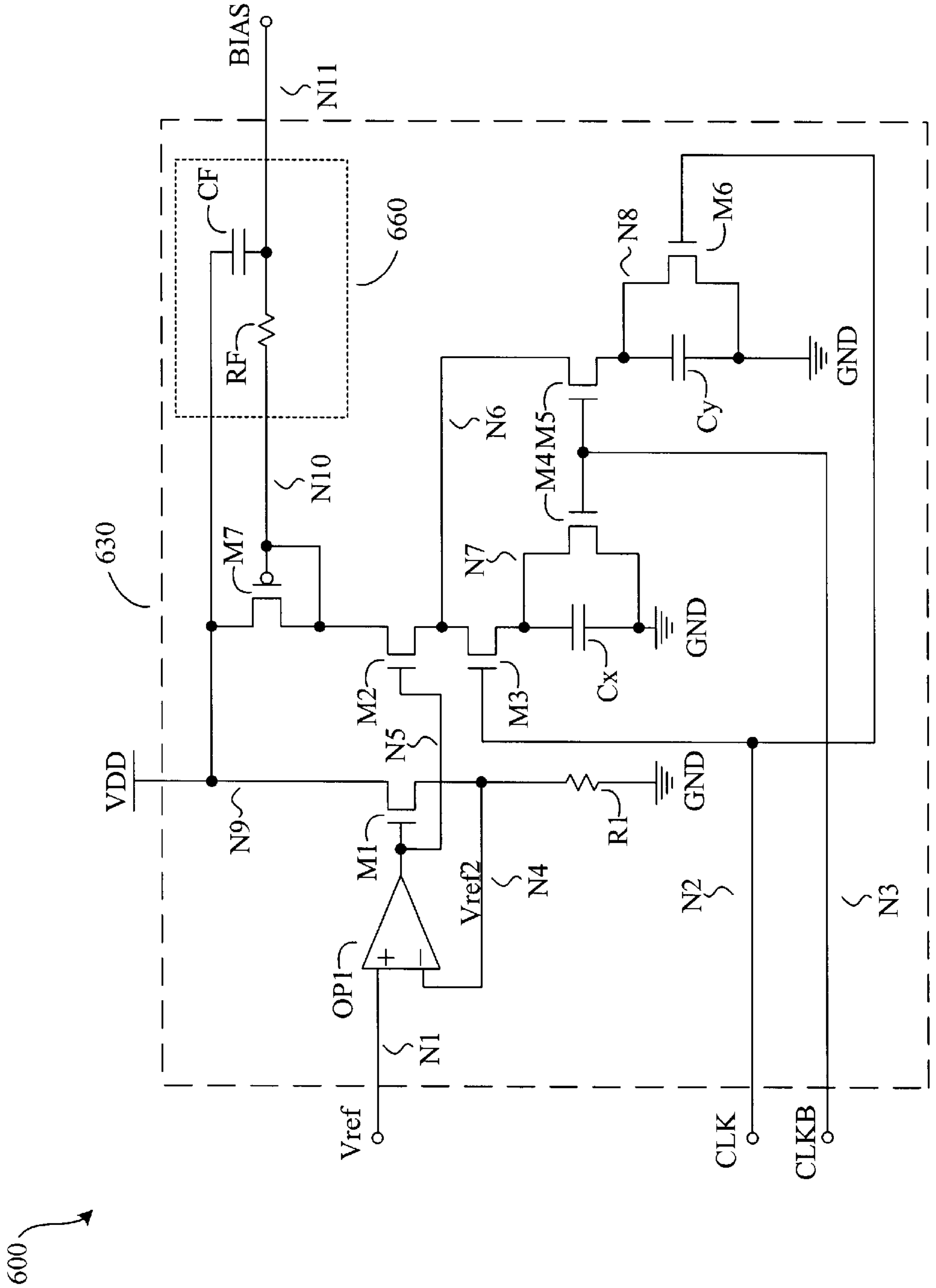
FIG. 6 illustrates a more detailed schematic diagram of the bias generator with output current dependent upon clock frequency showing the ripple suppression in greater detail, in accordance with the present invention.

FIG. 6 illustrates another exemplary schematic diagram in accordance with the present invention. The bias generator (630) includes an op-amp (OP1), six NMOS transistors (M1–M6), a PMOS transistor (M7), a resistor (R1), two capacitors (Cx, Cy) and a ripple filter (660). The ripple filter (660) includes a capacitor (CF) and a resistor (RF).

The op-amp (OP1) has a non-inverting input that is coupled to a first node (N1), an inverting input that is coupled to a fourth node (N4), and an output that is coupled to a fifth node (N5). The first NMOS transistor (M1) has a source that is coupled to the fourth node (N4), a drain that is coupled to a ninth node (N9), and a gate that is coupled to the fifth node (N5). The second NMOS transistor (M2) has a source that is coupled to a sixth node (N6), a drain that is coupled to a tenth node (N10), and a gate that is coupled to the fifth node (N5). The third NMOS transistor (M3) has a source that is coupled to a seventh node (N7), a drain that is coupled to the sixth node (N6), and a gate that is coupled to a second node (N2). The fourth NMOS transistor (M4) has a drain that is coupled to the seventh node (N7), a source that is coupled to a ground terminal (GND), and a gate that is coupled to a third node (N3). A first capacitor (Cx) is coupled in series between the seventh node (N7) and the ground terminal (GND). The fifth NMOS transistor (M5) has a drain that is coupled to the sixth node (N6), a source that is coupled to an eighth node (N8), and a gate that is coupled to the third node (N3). The sixth NMOS transistor (M6) has a drain that is coupled to the eighth node (N8), a source that is coupled to the ground terminal (GND), and a gate that is coupled to the second node (N2). A second capacitor (Cy) is coupled in series between the eighth node (N8) and the ground terminal (GND). The PMOS transistor (M7) has a drain that is coupled to the ninth node (N9), and a gate and source that are coupled to the tenth node (N10). The ripple filter (660) is coupled between the tenth node (N10) and an eleventh node (N11). A resistor (R1) is coupled in series between the fourth node (N4) and the ground terminal (GND).

In the ripple filter (660), the capacitor (CF) is coupled in series between to the ninth node (N9) and the eleventh node (N11). The resistor (RF) is coupled in series between the tenth node (N10) and the eleventh node (N11). It is appreciated that the capacitor (CF) can be replaced by any capacitance circuit and the resistor (RF) can be replaced by any resistance circuit.

The bias generator (600) operates similar to the bias generator (500) shown in FIG. 5. As previously stated, the rise and fall in the average current is referred to as ripple in the average current. Two capacitors (Cx, Cy) that are arranged to charge out-of-phase with respect to one another are used to reduce the ripple in the average current prior to reaching the ripple filter (660). Since the diode connected device (M7) is conducting current twice as often as compared to a single capacitor, the amount and duration of the ripple in the average current and the corresponding bias signal (BIAS) is reduced. The filter capacitor (CF) of the ripple filter (660) further reduces the ripple in the average current. The filter capacitor (CF) is arranged to store the potential at the tenth node (N10) in response to the average current delivered to the tenth node (N10). Thus, the filter capacitor (CF) acts as a smoothing or averaging circuit that minimizes variations in the potential at the tenth node (N10). Reducing the ripple in the potential at the tenth node (N10) results in the average current having reduced ripple. By using two smaller, out-of-phase capacitors (Cx, Cy), the potential at the tenth node (N10) is refreshed more often than when a single capacitor is used. Refreshing the potential at node 10 at a greater rate reduces the ripple in the potential, resulting in a smaller remaining ripple for the filter capacitor (CF). The remaining ripple is reduced from using two half-sized, out-of-phase capacitors (Cx, Cy), rather than a single capacitor, such that the size required for the filter capacitor (CF) may be reduced. For example, depending on the ripple filter (660) used, the filter capacitor (CF) may be one-quarter the sized filter capacitor with a two-capacitor arrangement when compared to a single capacitor arrangement in the bias generator (600).

In this example a filter resistor (RF) is also included in the ripple filter (660). The filter resistor (RF) in combination with the filter capacitor (CF) are arranged to operate as a low-pass filter. The low-pass filter prevents high frequency noise from affecting the bias generator (600).

It is appreciated and understood that other circuits may be configured to act as a signal filter in place of the present ripple filter (660) shown in FIG. 6. It is also appreciated and understood that the switching transistors shown in each figure can be replaced by a switch circuit of any type. In addition, the MOS transistors may be replaced by BJT transistors, JFET transistors, GaAsFET transistors, as well as other types of transistors. The capacitors shown in each figure can be a capacitive circuit or any other circuit that is arranged to provide a charge storage function.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus that produces a frequency dependent bias signal for a switched capacitor circuit, wherein the frequency dependent bias signal is dependent on a reference clock signal that has a corresponding clock frequency, and the switched capacitor circuit includes a type of capacitive circuit, the apparatus comprising:

a control circuit that is arranged to produce a control signal in response to a reference potential;

a controlled circuit that is arranged to produce a regulated potential in response to the control signal, wherein the regulated potential is related to the reference potential;

a capacitive circuit that is the same type as the type of capacitive circuit within the switched capacitor circuit;

a discharging circuit that is arranged to discharge the capacitive circuit in response to a clock signal when the clock signal corresponds to a first logic level;

a charging circuit that is arranged to couple a charging current to the capacitive circuit in response to the control signal when the clock signal corresponds to a second logic level that is different from the first logic level such that the charging current charges the capacitive circuit; and a sense circuit that is arranged to produce the frequency dependent bias signal in response to an average of the charging current, wherein the average of the charging current is related to the clock signal.

2. The apparatus of claim 1, wherein the capacitive circuit charges to the regulated potential while the clock signal corresponds to the second logic level.

3. The apparatus of claim 1, wherein the regulated potential equals the reference potential.

4. The apparatus of claim 1, the controlled circuit further comprising a MOS transistor that is arranged to couple the charging current to the capacitive circuit.

5. The apparatus of claim 1, wherein the switched capacitor circuit has an associated power consumption that decreases when the corresponding clock frequency of the reference clock signal decreases.

6. The apparatus of claim 1, wherein the capacitive circuit is arranged to match an orientation of the type of capacitive circuit within the switched capacitor circuit such that effects from parasitic capacitances affect the apparatus and the switched capacitor circuit similarly.

7. The apparatus of claim 1, wherein the corresponding clock frequency and the frequency dependent bias signal are linearly related to one another when a time associated with charging the capacitive circuit is within an associated pulse-width of the clock signal.

8. The apparatus of claim 1, wherein the corresponding clock frequency and the frequency dependent bias signal are non-linearly related to one another when a time associated with charging the capacitive circuit is greater than the associated pulse-width of the clock signal.

9. The apparatus of claim 1, further comprising a ripple filter that is arranged to reduce a ripple associated with the frequency dependent bias signal.

10. The apparatus of claim 1, wherein the clock signal is related to the reference clock signal by a scaling factor.

11. The apparatus of claim 1, wherein the clock signal is a non-overlapping type of clock signal that is related to the reference clock signal.

12. The apparatus of claim 1, further comprising a second capacitive circuit that is arranged to charge as the capacitive circuit discharges and arranged to discharge as the capacitive circuit charges such that the frequency dependent bias signal is produced by a complimentary out-of-phase operation of the capacitive circuit in combination with the second capacitive circuit, whereby the size of each capacitive circuit may be reduced in size.

13. An apparatus that generates a bias signal that is dependent on a reference clock signal having a corresponding clock frequency and a corresponding pulse-width, the apparatus comprising:

a controlled current circuit that is arranged to produce a charging current when a sensed potential at a sense node is different from a reference potential;

a first capacitive circuit;

a first charging circuit that is arranged to couple the sense node to the first capacitive circuit in response to a first phase of a first clock signal such that the charging current charges the first capacitive circuit to a first charged potential during a first charging phase;

a first discharging circuit that is arranged to discharge the first capacitive circuit in response to a second phase of the first clock signal;

a second capacitive circuit;

a second charging circuit that is arranged to couple the sense node to the second capacitive circuit in response to a first phase of a second clock signal such that the charging current charges the second capacitive circuit to a second charged potential during a second charging phase;

a second discharging circuit that is arranged to discharge the second capacitive circuit in response to the a second phase of the second clock signal; and an averaging circuit that is arranged to produce the bias signal in response to an average charging current, wherein the average charging current corresponds to an average of the charging current that is produced by the controlled current circuit such that the bias signal changes with changes in the reference clock signal.

14. The apparatus of claim 13, wherein the first phase of the first clock signal and the first phase of the second clock signal have equal pulse-widths that are related to the corresponding pulse-width of the reference clock signal.

15. The apparatus of claim 13, wherein the first phase of the first clock signal and the second phase of the second clock signal are aligned in time.

16. The apparatus of claim 13, wherein the first and second clock signals are derived from the reference clock signal, and the first phase of the first clock signal and the first phase of the second clock signal are non-overlapping with respect to one another.

17. The apparatus of claim 13, further comprising a ripple filter that is arranged to minimize a ripple associated with the bias signal.

18. The apparatus of claim 13, the controlled current circuit further comprising a transistor that is biased to provide the charging current to the sense node when the sensed potential at the sense node is different from the reference potential.

19. The apparatus of claim 13, wherein a power consumption associated with a subsequent circuit that is biased by the bias signal decreases as the corresponding clock frequency decreases.

20. The apparatus of claim 19, wherein the subsequent circuit includes another capacitive circuit that is matched in type and orientation to the first and second capacitive circuits such that effects from parasitic capacitances effect the apparatus and the subsequent circuit similarly.

21. The apparatus of claim 13, wherein the corresponding clock frequency and the bias signal have a linear relationship with respect to one another when the first and the second charged potentials are substantially the same as the reference potential at the end of the first and second charging phases respectively.

22. The apparatus of claim 13, wherein the corresponding clock frequency and the bias signal have a non-linear relationship with respect to one another when the first and the second charged potentials are substantially different from the reference potential at the end of the first and second charging phases respectively.

23. A method for generating a frequency dependent bias signal, comprising:

sensing a potential at a sense node to produce a sensed potential;

coupling a charging current to the sense node when the sensed potential is different from a reference potential;

coupling the sense node to a first capacitive circuit such that the first capacitive circuit charges with a first charging current during a first phase of a first clock signal;

decoupling the sense node from the first capacitive circuit during a second phase of the first clock signal;

discharging the first capacitive circuit during the second phase of the first clock signal;

coupling the sense node to a second capacitive circuit such that the second capacitive circuit charges with a second charging current during a first phase of a second clock signal, wherein the first phase of the first clock signal is inactive when the first phase of the second clock signal is active;

decoupling the sense node from the second capacitive circuit during a second phase of the second clock signal;

discharging the second capacitive circuit during the second phase of the second clock signal; and generating a bias signal in response to an average current that corresponds to an average of the first and second charging currents such that the bias signal is related to a frequency associated with the first and second clock signals.

24. The method in claim 23, further comprising suppressing a ripple associated with the bias signal.

25. The method in claim 23, further comprising coupling the biasing signal to another circuit that has an associated power consumption that is controlled by the frequency associated with the first and second clock signals such that a decrease in the frequency results in decreased power consumption in the another circuit.

26. The method in claim 23, further comprising:

coupling the biasing signal to another circuit; and matching a type and orientation of another capacitive circuit to the first and second capacitive circuits, wherein the another capacitive circuit is included in the another circuit such that a parasitic effect in the another capacitive circuit is matched to parasitic effects in the first and second capacitive circuits.

27. An apparatus for providing a bias signal for a switched-capacitor circuit that uses a reference clock signal with a corresponding reference clock frequency, the apparatus comprising:

a means for producing a first clock signal is arranged to produce a first clock signal in response to the reference clock signal, the first clock signal having a first and second phase;

a means for producing a second clock signal is arranged to produce a second clock signal in response to the reference clock signal, the second clock signal having a first and second phase, wherein the first phase of the second clock signal is non-overlapping with respect to the first phase of the first clock signal;

a means for sensing is arranged to sense a sensed potential at a sense node;

a means for producing a current is arranged to provide a charging current when the sensed potential is different from a reference potential;

a first means for charging is arranged to couple the sense node to a first capacitive circuit such that the first capacitive circuit is charged with a first charging current to a first charged potential in response to the first phase of the first clock signal;

a first means for discharging is arranged to discharge the first capacitive circuit in response to the second phase of the first clock signal;

a second means for charging is arranged to couple the sense node to a second capacitive circuit such that the second capacitive circuit is charged with a second charging current to a second charged potential in response to the first phase of the second clock signal;

a second means for discharging is arranged to discharge the second capacitive circuit in response to the second phase of the second clock signal; and an averaging means is arranged to produce the bias signal in response to an average of the charging current, wherein the average of the charging current corresponds to the first and second charging currents such that the average of the charging current is related to the reference clock frequency.

28. The apparatus of claim 27, wherein the power consumption of the switched-capacitor circuit decreases as the reference clock frequency decreases.

29. The apparatus of claim 27, further comprising a means for reducing ripple is arranged to reduce a ripple associated with the bias signal.

30. The apparatus of claim 27, wherein the first and second capacitive circuits are of a type and orientation that are matched to other capacitive circuits within the switched capacitor circuit.

* * * * *